(12) United States Patent
Han

(10) Patent No.: US 12,002,835 B2
(45) Date of Patent: Jun. 4, 2024

(54) BACKSIDE ILLUMINATED IMAGE SENSOR AND METHOD OF MANUFACTURING THE SAME

(71) Applicant: DB HITEK CO., LTD., Seoul (KR)

(72) Inventor: Chang Hun Han, Gyeonggi-do (KR)

(73) Assignee: DB HITEK CO., LTD., Seoul (KR)

( * ) Notice: Subject to any disclaimer, the term of this patent is extended or adjusted under 35 U.S.C. 154(b) by 267 days.

(21) Appl. No.: 17/460,961

(22) Filed: Aug. 30, 2021

(65) Prior Publication Data

US 2022/0068984 A1 Mar. 3, 2022

(30) Foreign Application Priority Data

Aug. 31, 2020 (KR) .......................... 10-2020-0109976

(51) Int. Cl.
*H01L 27/146* (2006.01)

(52) U.S. Cl.
CPC ...... *H01L 27/1464* (2013.01); *H01L 27/1462* (2013.01); *H01L 27/14623* (2013.01); *H01L 27/14636* (2013.01); *H01L 27/14685* (2013.01)

(58) Field of Classification Search
CPC ............ H01L 27/1464; H01L 27/1462; H01L 27/14685; H01L 27/14636; H01L 23/481; H01L 24/05
See application file for complete search history.

(56) References Cited

U.S. PATENT DOCUMENTS

| | | | | |
|---|---|---|---|---|
| 8,502,389 B2* | 8/2013 | Ho | ............... | H01L 21/76898 438/70 |
| 8,796,805 B2* | 8/2014 | Ting | ............... | H01L 27/1464 438/57 |
| 8,866,250 B2* | 10/2014 | Ting | ............... | H01L 27/14636 438/70 |
| 9,165,970 B2* | 10/2015 | Tsai | ............... | H01L 27/14638 |
| 9,570,497 B2* | 2/2017 | Tsai | ............... | H01L 27/14687 |
| 9,818,776 B2* | 11/2017 | Borthakur | ............... | H01L 27/1446 |
| 9,871,070 B2* | 1/2018 | Hsu | ............... | H01L 27/1463 |
| 10,217,783 B2* | 2/2019 | Borthakur | ............... | H01L 27/1464 |
| 10,566,378 B2* | 2/2020 | Tsai | ............... | H01L 27/14645 |
| 10,923,522 B2* | 2/2021 | Han | ............... | H01L 27/14621 |
| 10,950,649 B2* | 3/2021 | Han | ............... | H01L 27/14621 |
| 11,296,138 B2* | 4/2022 | Han | ............... | H01L 27/14636 |
| 11,362,130 B2* | 6/2022 | Han | ............... | H01L 27/14623 |
| 11,430,909 B2* | 8/2022 | Sung | ............... | H01L 27/14687 |
| 11,476,295 B2* | 10/2022 | Tsai | ............... | H01L 27/1464 |
| 2012/0205769 A1* | 8/2012 | Tsai | ............... | H01L 27/14683 438/66 |

(Continued)

*Primary Examiner* — Mounir S Amer
*Assistant Examiner* — Alexander Belousov
(74) *Attorney, Agent, or Firm* — Husch Blackwell LLP

(57) ABSTRACT

A backside illuminated image sensor and a method of manufacturing the same are disclosed. The backside illuminated image sensor includes a substrate having a frontside surface, a backside surface and a recess formed in a backside surface portion thereof, pixel regions disposed in the substrate, an insulating layer disposed on the frontside surface of the substrate, a bonding pad disposed on a frontside surface of the insulating layer, a second bonding pad formed with a constant thickness on a bottom surface and an inner side surface of the recess to form a second recess in the recess and electrically connected with the bonding pad, and a third bonding pad formed in the second recess to fill the second recess.

10 Claims, 18 Drawing Sheets

(56) References Cited

U.S. PATENT DOCUMENTS

| | | | | |
|---|---|---|---|---|
| 2013/0037958 A1* | 2/2013 | Ho | ............... | H01L 24/05 |
| | | | | 257/E23.079 |
| 2014/0061839 A1* | 3/2014 | Ting | ............... | H01L 27/1464 |
| | | | | 438/70 |
| 2014/0061842 A1* | 3/2014 | Ting | ............... | H01L 27/14687 |
| | | | | 257/E31.124 |
| 2016/0027836 A1* | 1/2016 | Tsai | ............... | H01L 27/14683 |
| | | | | 438/66 |
| 2016/0300962 A1* | 10/2016 | Borthakur | ......... | H01L 27/14685 |
| 2017/0154918 A1* | 6/2017 | Tsai | ............... | H01L 27/14683 |
| 2019/0333947 A1* | 10/2019 | Han | ............... | H01L 27/14623 |
| 2020/0091209 A1* | 3/2020 | Han | ............... | H01L 27/14689 |
| 2020/0144325 A1* | 5/2020 | Tsai | ............... | H01L 27/14638 |
| 2020/0235144 A1* | 7/2020 | Han | ............... | H01L 27/14621 |
| 2020/0235145 A1* | 7/2020 | Han | ............... | H01L 27/1464 |
| 2021/0143208 A1* | 5/2021 | Tsai | ............... | H01L 27/1464 |
| 2022/0068985 A1* | 3/2022 | Han | ............... | H01L 27/1464 |
| 2023/0163152 A1* | 5/2023 | Han | ............... | H01L 27/1463 |
| | | | | 257/431 |

\* cited by examiner

BACKSIDE ILLUMINATED IMAGE SENSOR AND METHOD OF MANUFACTURING THE SAME

CROSS-REFERENCE TO RELATED APPLICATION

This application claims the priority benefit of Korean Patent Application No. 10-2020-0109976, filed on Aug. 31, 2020, and all the benefits accruing therefrom under 35 U.S.C. § 119, the contents of which are incorporated by reference in their entirety.

BACKGROUND

The present disclosure relates to a backside illuminated image sensor and a method of manufacturing the same. More specifically, the present disclosure relates to a backside illuminated image sensor including a color filter layer and a microlens array on a backside surface of a substrate, and a method of manufacturing the backside illuminated image sensor.

In general, an image sensor is a semiconductor device that converts an optical image into electrical signals, and may be classified or categorized as a Charge Coupled Device (CCD) or a Complementary Metal Oxide Semiconductor (CMOS) Image Sensor (CIS).

The CIS includes unit pixels, each including a photodiode and MOS transistors. The CIS sequentially detects the electrical signals of the unit pixels using a switching method, thereby forming an image. The CIS may be classified as either a frontside illuminated image sensor or a backside illuminated image sensor.

The backside illuminated image sensor may include pixel regions in a substrate, transistors formed on a frontside surface of the substrate, an insulating layer formed on the transistors, bonding pads on the insulating layer, an anti-reflective layer formed on a backside surface of the substrate, a light-blocking pattern layer formed on the anti-reflective layer, a color filter layer formed on the anti-reflective layer and the light-blocking pattern layer, and a microlens array formed on the color filter layer.

Second bonding pads connected to the bonding pads through the anti-reflective layer, the substrate, and the insulating layer may be formed on the anti-reflective layer, and third bonding pads may be formed on the second bonding pads. Further, wires may be bonded on the third bonding pads or solder bumps may be formed on the third bonding pads.

The color filter layer may include red filters, blue filters and green filters. Each of the filters may be formed by forming a photoresist layer having a color on the anti-reflective layer and the light-blocking pattern layer and then performing a photolithography process. The photoresist layer may be formed by a spin coating process, and stripe defects may occur in the photoresist layer by the second and third bonding pads during the spin coating process.

SUMMARY

The present disclosure provides a backside illuminated image sensor having an improved structure and a method of manufacturing the backside illuminated image sensor.

In accordance with an aspect of the present disclosure, a backside illuminated image sensor may include a substrate having a frontside surface, a backside surface and a recess formed in a backside surface portion thereof, pixel regions disposed in the substrate, an insulating layer disposed on the frontside surface of the substrate, a bonding pad disposed on a frontside surface of the insulating layer, a second bonding pad formed with a constant thickness on a bottom surface and an inner side surface of the recess to form a second recess in the recess and electrically connected with the bonding pad, and a third bonding pad formed in the second recess to fill the second recess.

In accordance with some embodiments of the present disclosure, the second bonding pad may include an edge portion formed on a second backside surface portion of the substrate adjacent to the recess.

In accordance with some embodiments of the present disclosure, the third bonding pad may have a thickness equal to a depth of the second recess.

In accordance with some embodiments of the present disclosure, the backside illuminated image sensor may further include a light-blocking pattern layer formed on the backside surface of the substrate and having openings corresponding to the pixel regions, respectively. In this case, the second bonding pad may have the same thickness as the light-blocking pattern layer.

In accordance with some embodiments of the present disclosure, when the backside surface of the substrate faces upward, the third bonding pad may be formed to protrude upward from the edge portion of the second bonding pad.

In accordance with some embodiments of the present disclosure, the backside illuminated image sensor may further include a light-blocking pattern layer formed on the backside surface of the substrate and having openings corresponding to the pixel regions, respectively; and a planarization layer formed on the backside surface of the substrate and the light-blocking pattern layer. In this case, when the backside surface of the substrate faces upward, an upper surface of the third bonding pad may have the same height as an upper surface of the planarization layer.

In accordance with some embodiments of the present disclosure, the backside illuminated image sensor may further include an anti-reflective layer disposed on the backside surface of the substrate and the bottom surface and the inner side surface of the recess. In this case, the second bonding pad may be formed on the anti-reflective layer.

In accordance with some embodiments of the present disclosure, the anti-reflective layer, the substrate and the insulating layer may have a first through-hole, a second through-hole and a third through-hole for exposing a portion of a backside surface of the bonding pad, respectively.

In accordance with some embodiments of the present disclosure, the second bonding pad may include a connecting portion formed on inner side surfaces of the first through-hole, the second through-hole and the third through-hole, and the exposed portion of the backside surface of the bonding pad.

In accordance with some embodiments of the present disclosure, the backside illuminated image sensor may further include a spacer formed on the inner side surfaces of the first through-hole, the second through-hole and the third through-hole. In this case, the connecting portion of the second bonding pad may be formed on the spacer.

In accordance with some embodiments of the present disclosure, the third bonding pad may have a third recess corresponding to the first through-hole, the second through-hole and the third through-hole.

In accordance with some embodiments of the present disclosure, the backside illuminated image sensor may further include a second spacer formed on a portion of the anti-reflective layer formed on the inner side surface of the recess.

In accordance with some embodiments of the present disclosure, a ring-shaped groove may be formed on a backside surface of the third bonding pad.

In accordance with another aspect of the present disclosure, a method of manufacturing a backside illuminated image sensor may include forming pixel regions in a substrate, forming an insulating layer on a frontside surface of the substrate, forming a bonding pad on a frontside surface of the insulating layer, partially removing a backside surface portion of the substrate to form a recess, forming a second bonding pad to be electrically connected with the bonding pad, the second bonding pad having a constant thickness and being formed on a bottom surface and an inner side surface of the recess to form a second recess in the recess, and forming a third bonding pad in the second recess to fill the second recess.

In accordance with some embodiments of the present disclosure, the second bonding pad may include an edge portion formed on a second backside surface portion of the substrate adjacent to the recess, and the third bonding pad may have a thickness equal to a depth of the second recess.

In accordance with some embodiments of the present disclosure, the second bonding pad may include an edge portion formed on a second backside surface portion of the substrate adjacent to the recess, and when the backside surface of the substrate faces upward, the third bonding pad may be formed to protrude upward from the edge portion of the second bonding pad.

In accordance with some embodiments of the present disclosure, the method may further include forming an anti-reflective layer on the backside surface of the substrate and the bottom surface and the inner side surface of the recess. In this case the second bonding pad may be formed on the anti-reflective layer.

In accordance with some embodiments of the present disclosure, the method may further include forming a first through-hole passing through a portion of the anti-reflective layer formed on the bottom surface of the recess, a second through-hole passing through the substrate, and a third through-hole passing through the insulating layer to expose a portion of a backside surface of the bonding pad. In this case, the second bonding pad may include a connecting portion formed on inner side surfaces of the first through-hole, the second through-hole and the third through-hole, and the exposed portion of the backside surface of the bonding pad.

In accordance with some embodiments of the present disclosure, the method may further include forming a spacer on the inner side surfaces of the first through-hole, the second through-hole and the third through-hole. In this case, the connecting portion of the second bonding pad may be formed on the spacer.

In accordance with some embodiments of the present disclosure, the method may further include forming a light-blocking pattern layer on the backside surface of the substrate, the light-blocking pattern layer having openings corresponding to the pixel regions, respectively. In this case, the second bonding pad may be simultaneously formed of the same material as the light-blocking pattern layer.

In accordance with the embodiments of the present disclosure as described above, the third bonding pad may be formed in the second recess of the second bonding pad and may have a thickness equal to the depth of the second recess. Further, the second bonding pad may include an edge portion formed on the second backside surface portion of the substrate adjacent to the recess and may have the same thickness as the light blocking pattern layer. Accordingly, stripe defects may be prevented from occurring during a spin coating process for forming a color filter layer.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which.

Figure 1:
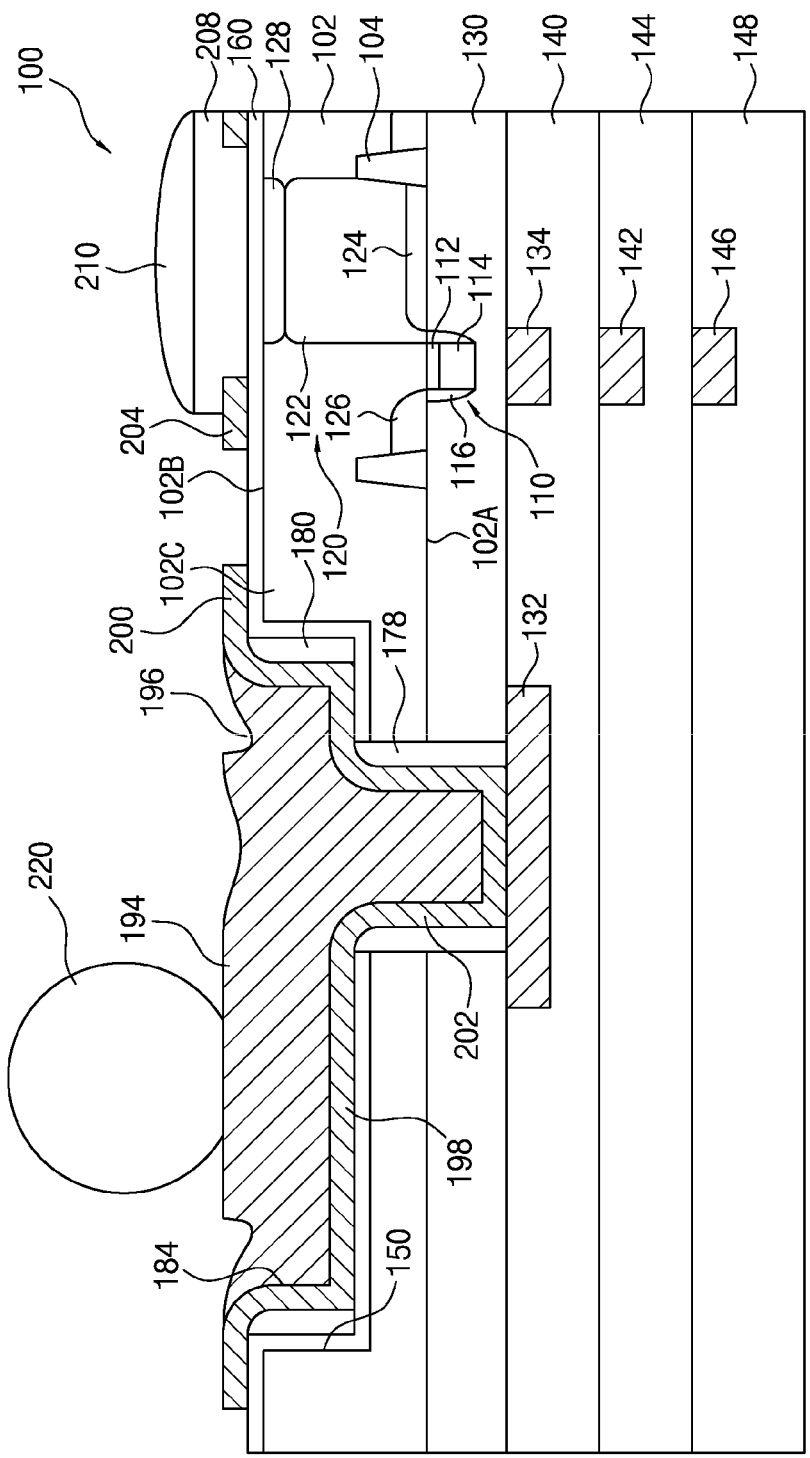
FIG. 1 is a cross-sectional view illustrating a backside illuminated image sensor in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

FIG. 1 is a cross-sectional view illustrating a backside illuminated image sensor in accordance with an embodiment of the present disclosure.

Referring to FIG. 1, a backside illuminated image sensor 100, in accordance with an embodiment of the present disclosure, may include a substrate 102 having a frontside surface 102A, a backside surface 102B and a recess 150 formed in a backside surface portion of the substrate 102, pixel regions 120 formed in the substrate 102, an insulating layer 130 formed on the frontside surface 102A of the substrate 102, a bonding pad 132 formed on a frontside surface of the insulating layer 130, a second bonding pad 198 formed in the recess 150 and electrically connected with the bonding pad 132, and a third bonding pad 194 formed on the second bonding pad 198. Particularly, the second bonding pad 198 may be formed with a constant thickness on a bottom surface and an inner surface of the recess 150 to form a second recess 184 in the recess 150, and the third bonding pad 194 may be formed on the second bonding pad 198 to fill the second recess 184.

In accordance with an embodiment of the present disclosure, the second bonding pad 198 may include an edge portion 200 formed on a second backside surface portion 102C of the substrate 102 adjacent to the recess 150. For example, the edge portion 200 of the second bonding pad 198 may have a ring shape, and the third bonding pad 194 may have a thickness equal to a depth of the second recess 184. That is, as shown in FIG. 1, when the backside surface 102B of the substrate 102 faces upward, an upper surface of the third bonding pad 194, i.e., a backside surface of the third bonding pad 194 may have the same height as an upper surface of the second bonding pad 198, i.e., a backside surface of the second bonding pad 198.

Each of the pixel regions 120 may include a charge accumulation region 122 in which charges generated by the incident light are accumulated. The charge accumulation regions 122 may be disposed in the substrate 102, and floating diffusion regions 126 may be disposed in frontside surface portions of the substrate 102 to be spaced apart from the charge accumulation regions 122.

The substrate 102 may have a first conductivity type, and the charge accumulation regions 122 and the floating diffusion regions 126 may have a second conductivity type. For example, a p-type substrate may be used as the substrate 102, and n-type impurity diffusion regions functioning as the charge accumulation regions 122 and the floating diffusion regions 126 may be formed in the p-type substrate 102. Alternatively, the substrate 102 may include a p-type epitaxial layer, and the charge accumulation regions 122 and the floating diffusion regions 126 may be formed in the p-type epitaxial layer.

Transfer gate structures 110 may be disposed on channel regions between the charge accumulation regions 122 and the floating diffusion regions 126 to transfer the charges accumulated in the charge accumulation regions 122 to the floating diffusion regions 126. Each of the transfer gate structures 110 may include a gate insulating layer 112 disposed on the frontside surface 102A of the substrate 102, a gate electrode 114 disposed on the gate insulating layer 112, and gate spacers 116 disposed on side surfaces of the gate electrode 114. Further, though not shown in FIG. 1, the backside illuminated image sensor 100 may include reset transistors, source follower transistors, and select transistors electrically connected with the floating diffusion regions 126.

Alternatively, if the backside illuminated image sensor 100 is a 3T (or fewer than three transistors) layout, the transfer gate structures 110 may be used as reset gate structures and the floating diffusion regions 126 may be used as active regions for connecting the charge accumulation regions 122 with reset circuitries.

Each of the pixel regions 120 may include a frontside pinning layer 124 disposed between the frontside surface 102A of the substrate 102 and the charge accumulation region 122. Further, each of the pixel regions 120 may include a backside pinning layer 128 disposed between the backside surface 102B of the substrate 102 and the charge accumulation region 122. The frontside and backside pinning layers 124 and 128 may have the first conductivity type. For example, p-type impurity diffusion regions may be used as the frontside and backside pinning layers 124 and 128.

A first wiring layer 134 may be disposed on the frontside surface of the insulating layer 130 and may be electrically connected with the pixel regions 120. The first wiring layer 134 may be made of the same material as the bonding pad 132.

Further, a second insulating layer 140 may be disposed on the frontside surface of the insulating layer 130, the bonding pad 132 and the first wiring layer 134, and a second wiring layer 142 may be disposed on the second insulating layer 140. A third insulating layer 144 may be disposed on the second insulating layer 140 and the second wiring layer 142, and a third wiring layer 146 may be disposed on the third insulating layer 144. A passivation layer 148 may be disposed on the third insulating layer 144 and the third wiring layer 146.

In accordance with an embodiment of the present disclosure, an anti-reflective layer 160 may be formed on the backside surface 102B of the substrate 102 and the bottom surface and the inner surface of the recess 150, and the second bonding pad 198 may be formed on the anti-reflective layer 160. For example, though not shown in FIG. 1, the anti-reflective layer 160 may include a metal oxide layer formed on the backside surface 102B of the substrate 102, a silicon oxide layer formed on the metal oxide layer, and a silicon nitride layer formed on the silicon oxide layer.

The anti-reflective layer 160, the substrate 102 and the insulating layer 130 may have a first through-hole 168 (refer to FIG. 10), a second through-hole 170 (refer to FIG. 10) and a third through-hole 172 (refer to FIG. 10) to expose a portion of a backside surface of the bonding pad 132, respectively. For example, the recess 150 and the bonding pad 132 may be disposed to correspond to each other. That is, when the backside surface 102B of the substrate 102 faces upward, the recess 150 may be disposed above the bonding pad 132, and the first through-hole 168, the second through-hole 170 and the third through-hole 172 may pass through a portion of the anti-reflective layer 160 formed on the bottom surface of the recess 150, the substrate 102, and the insulating layer 130, respectively.

The second bonding pad 198 may include a connecting portion 202 formed on inner side surfaces of the first through-hole 168, the second through-hole 170 and the third through-hole 172, and the exposed portion of the backside surface of the bonding pad 132. That is, the second bonding pad 198 may be connected to the backside surface of the bonding pad 132 through the first through-hole 168, the second through-hole 170 and the third through-hole 172, and the third bonding pad 194 may be formed to fill the first through-hole 168, the second through-hole 170 and the third through-hole 172.

In accordance with an embodiment of the present disclosure, a first spacer 178 made of an insulating material such as silicon oxide may be formed on the inner side surfaces of the first through-hole 168, the second through-hole 170 and the third through-hole 172. In such case, the connecting portion 202 of the second bonding pad 198 may be formed on the first spacer 178, and the substrate 102 may thus be electrically insulated from the second bonding pad 198 by the first spacer 178.

Further, a light-blocking pattern layer 204 having openings 206 (refer to FIG. 17) corresponding to the pixel regions 120, respectively, may be formed on the anti-reflective layer 160. The light-blocking pattern layer 204 may be made of the same material as the second bonding pad 198, and may be formed simultaneously with the second bonding pad 198. Particularly, the light-blocking pattern layer 204 may have the same thickness as the second bonding pad 198, and when the backside surface 102B of the substrate 102 faces upward, an upper surface of the light-blocking pattern layer 204, i.e., a backside surface of the light-blocking pattern layer 204 may have the same height as the backside surface of the second bonding pad 198 and the backside surface of the third bonding pad 194.

A color filter layer 208 may be formed on the anti-reflective layer 160 and the light-blocking pattern layer 204, and a microlens array 210 may be formed on the color filter layer 208. In addition, a solder bump 220 may be formed on the third bonding pad 194. Alternatively, a wire may be bonded on the third bonding pad 194 by a wire bonding process.

The color filter layer 208 may include red filters, green filters and blue filters. Each of the filters may be formed by forming a photoresist layer having a color on the anti-reflective layer 160 and the light-blocking pattern layer 204 through a spin coating process and then performing a photolithography process. In accordance with an embodiment of the present disclosure, the backside surfaces of the light-blocking pattern layer 204, the second bonding pad 198 and the third bonding pad 194 may all have the same height, and thus stripe defects may be prevented from occurring during the spin coating process.

Figure 2:
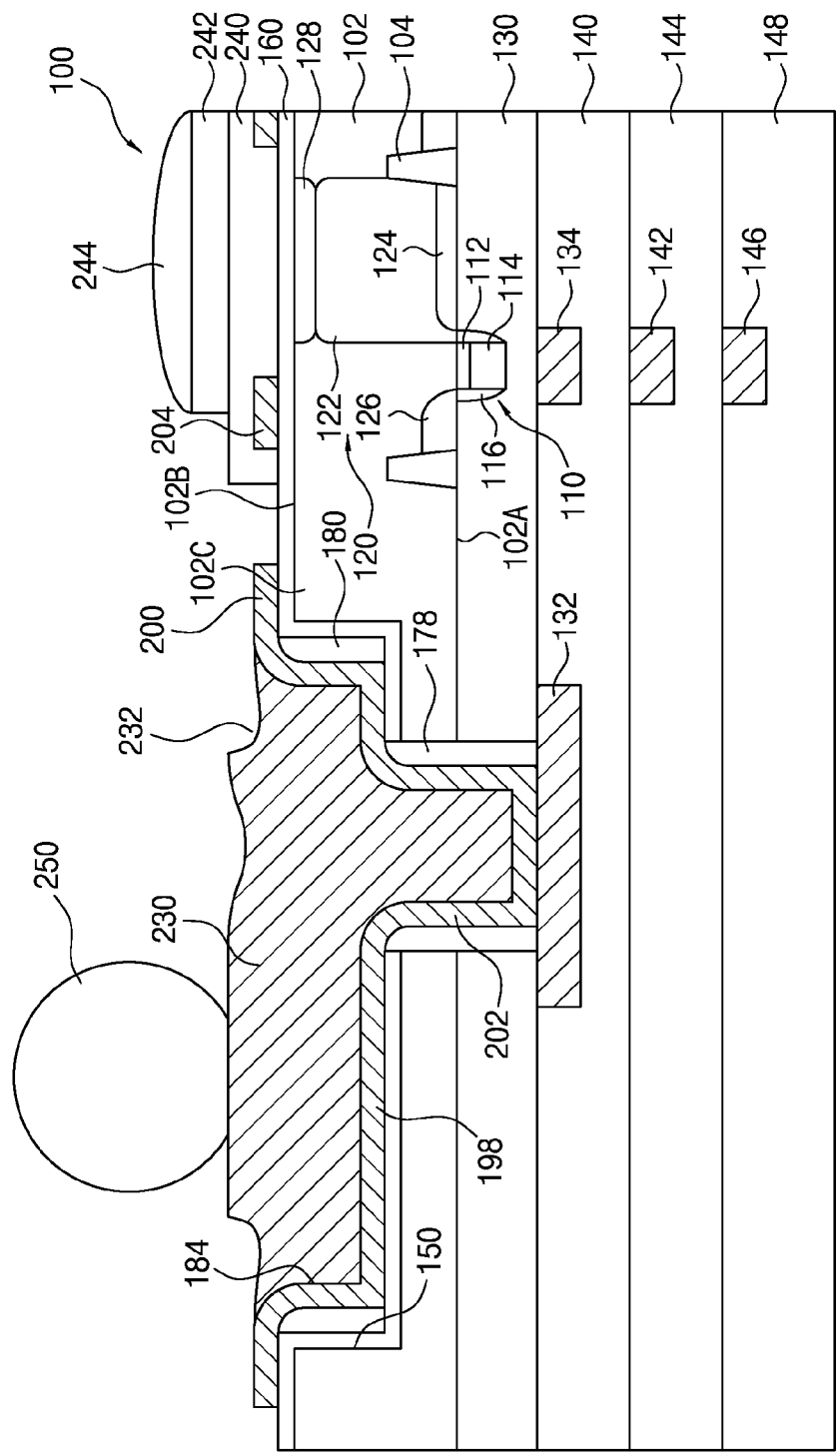
FIG. 2 is a cross-sectional view illustrating a backside illuminated image sensor in accordance with another embodiment of the present disclosure.

FIG. 2 is a cross-sectional view illustrating a backside illuminated image sensor in accordance with another embodiment of the present disclosure.

Referring to FIG. 2, the backside illuminated image sensor 100, in accordance with another embodiment of the present disclosure, may include a planarization layer 240 formed on the anti-reflective layer 160 and the light-blocking pattern layer 204. For example, the planarization layer 240 may be formed of an insulating material such as silicon oxide or silicon oxynitride. A third bonding pad 230 may be formed in the second recess 184. Particularly, the third bonding pad 230 may be formed to protrude upward from the edge portion 200 of the second bonding pad 198 when the backside surface 102B of the substrate 102 faces upward. Further, an upper surface of the third bonding pad 230, i.e., a backside surface of the third bonding pad 230, may have the same height as an upper surface of the planarization layer 240, i.e., a backside surface of the planarization layer 240 as shown in FIG. 2. Unless stated to the contrary in the following discussion, components having the same reference number from FIG. 1 have the same composition, structure, and/or function as those of FIG. 1.

A color filter layer 242 may be formed on the planarization layer 240, and a microlens array 244 may be formed on the color filter layer 242. In addition, a solder bump 250 may be formed on the third bonding pad 230. Alternatively, a wire may be bonded on the third bonding pad 230 by a wire bonding process.

The color filter layer 242 may include red filters, green filters and blue filters. Each of the filters may be formed by forming a photoresist layer having a color on the planarization layer 240 through a spin coating process and then performing a photolithography process. In accordance with another embodiment of the present disclosure, the backside surfaces of the third bonding pad 230 and the planarization layer 240 may all have the same height, and thus stripe defects may be prevented from occurring during the spin coating process.

FIGS. 3 to 18 are cross-sectional views illustrating a method of manufacturing the backside illuminated image sensor as shown in FIG. 1.

Figure 3:
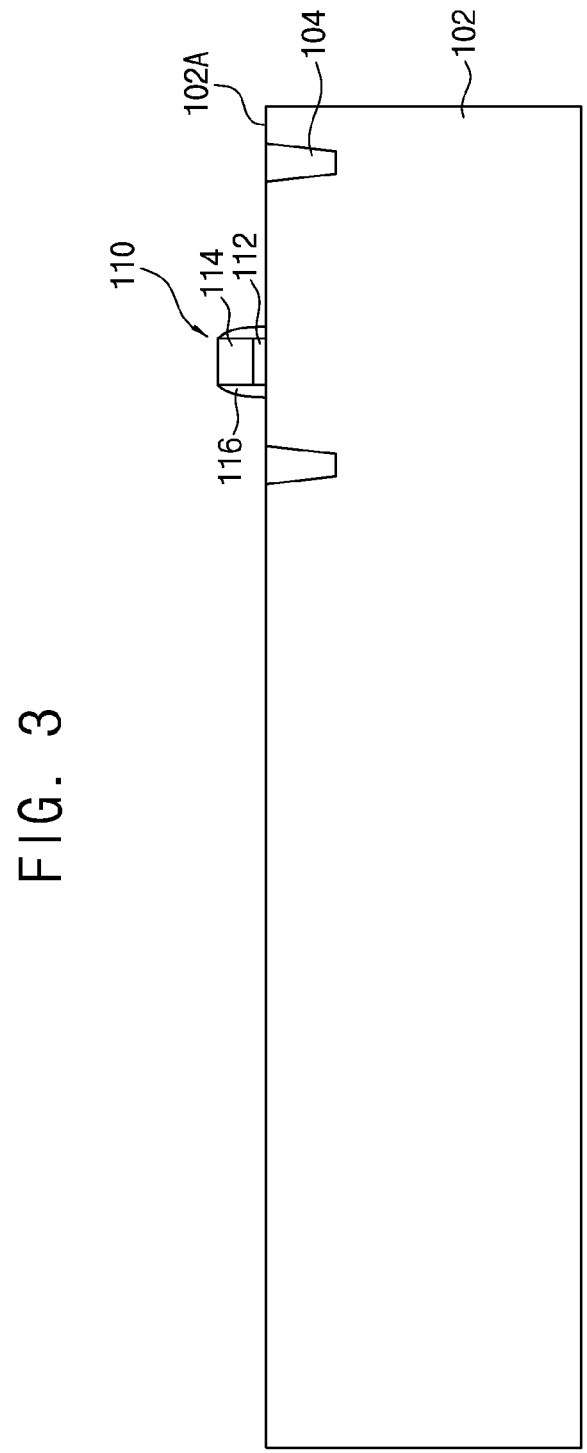
FIGS. 3 to 18 are cross-sectional views illustrating a method of manufacturing the backside illuminated image sensor as shown in FIG. 1.

Referring to FIG. 3, device isolation regions 104 may be formed in frontside surface portions of a substrate 102 to define active regions of the backside illuminated image sensor 100. The substrate 102 may have a first conductivity type. For example, a p-type substrate may be used as the substrate 102. Alternatively, the substrate 102 may include a bulk silicon substrate and a p-type epitaxial layer formed on the bulk silicon substrate. The device isolation regions 104 may be made of an insulating material such as silicon oxide and may be formed by a shallow trench isolation (STI) process.

After forming the device isolation regions 104, transfer gate structures 110 may be formed on a frontside surface 102A of the substrate 102. Each of the transfer gate structures 110 may include a gate insulating layer 112, a gate electrode 114 formed on the gate insulating layer 112 and gate spacers 116 formed on side surfaces of the gate electrode 114. Further, though not shown in figures, reset gate structures, source follower gate structures and select gate structures may be simultaneously formed with the transfer gate structures 110 on the frontside surface 102A of the substrate 102.

Figure 4:
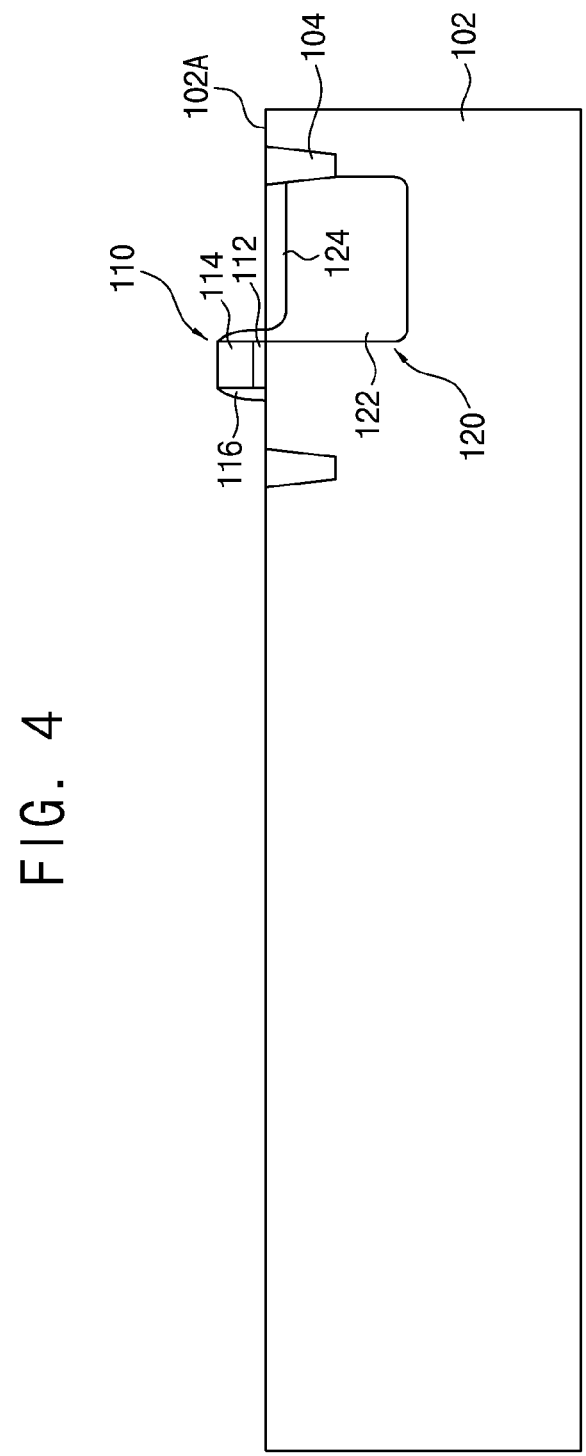

Referring to FIG. 4, charge accumulation regions 122 used as pixel regions 120 may be formed in the substrate 102. Specifically, charge accumulation regions 122 having a second conductivity type may be formed in the active regions of the substrate 102. For example, n-type charge accumulation regions 122 may be formed in the p-type substrate 102. The n-type charge accumulation regions 122 may be n-type impurity diffusion regions formed by an ion implantation process.

Then, frontside pinning layers 124 having the first conductivity type may be formed between the frontside surface 102A of the substrate 102 and the charge accumulation regions 122. For example, p-type frontside pinning layers 124 may be formed between the frontside surface 102A of the substrate 102 and the n-type charge accumulation regions 122 by an ion implantation process. The p-type frontside pinning layers 124 may be p-type impurity diffusion regions. The n-type charge accumulation regions 122 and the p-type frontside pinning layers 124 may be activated by a subsequent rapid heat treatment process.

Figure 5:
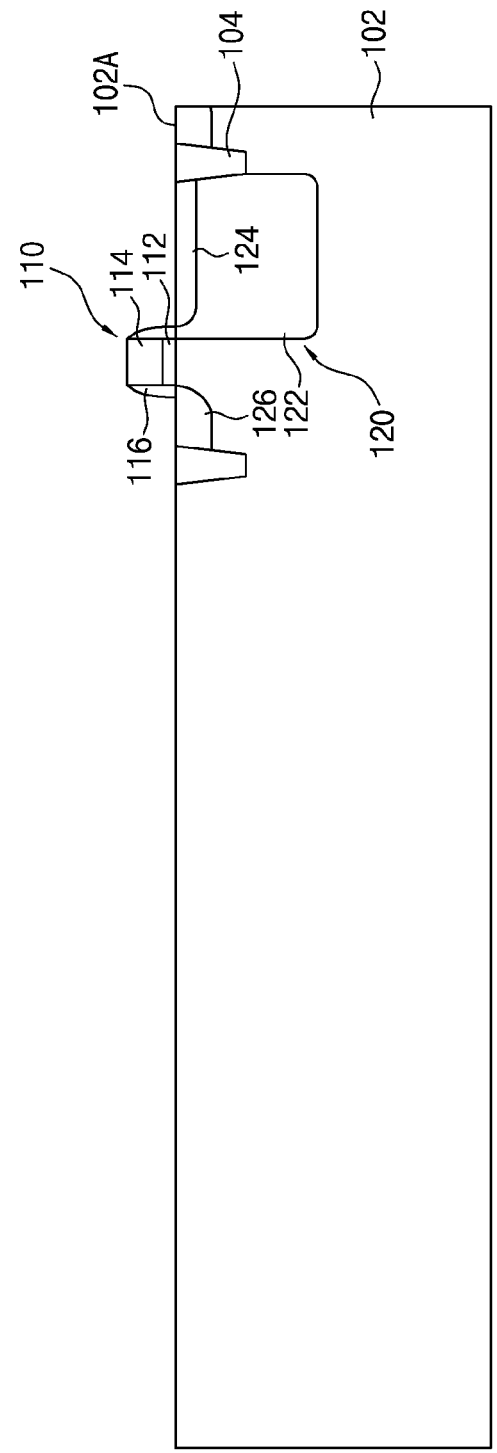

Referring to FIG. 5, floating diffusion regions 126 having the second conductivity type may be formed in frontside surface portions of the substrate 102 to be spaced apart from the charge accumulation regions 122. For example, the floating diffusion regions 126 may be n-type high concentration impurity regions, which may be formed by an ion implantation process. At this time, the transfer gate structures 110 may be arranged on channel regions between the charge accumulation regions 122 and the floating diffusion regions 126.

Figure 6:
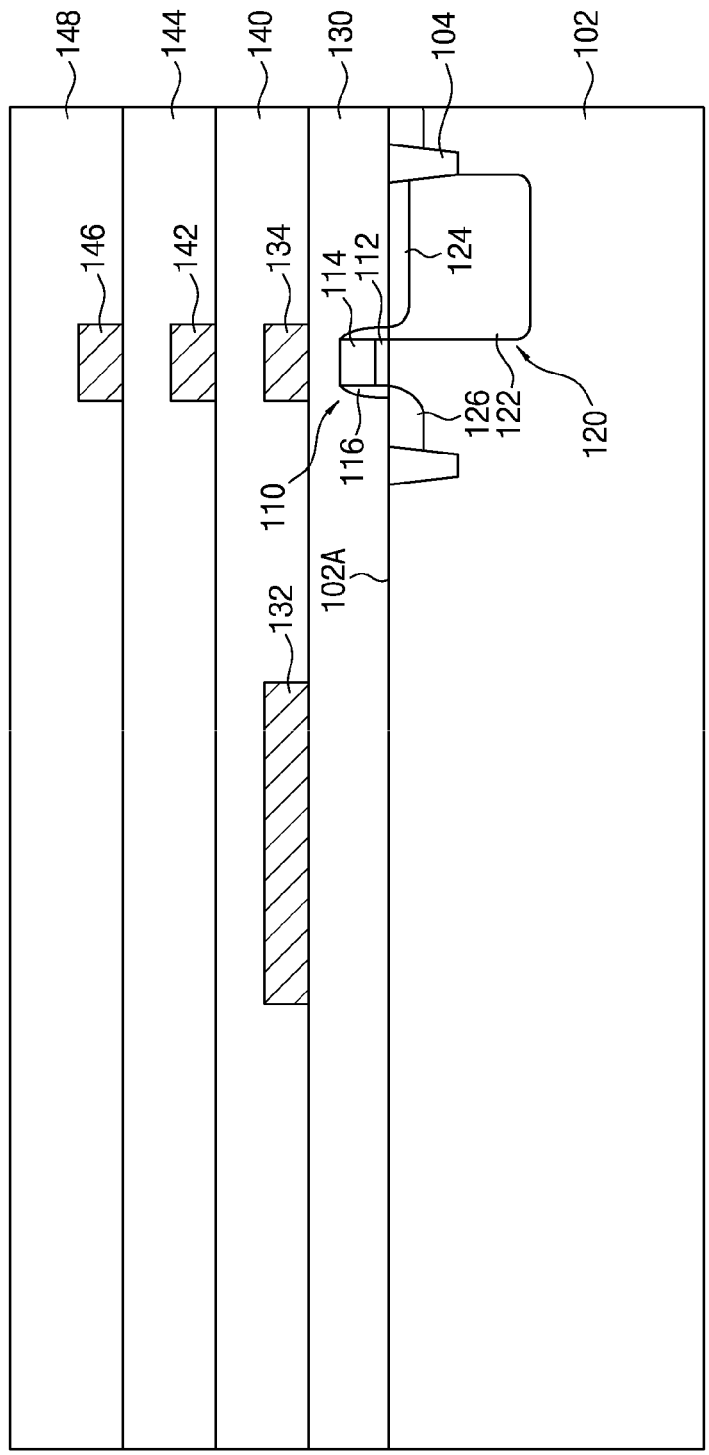

Referring to FIG. 6, an insulating layer 130 may be formed on the frontside surface 102A of the substrate 102, and a bonding pad 132 and a first wiring layer 134 may be formed on the insulating layer 130. The insulating layer 130 may be made of an insulating material such as silicon oxide, and the bonding pad 132 and the first wiring layer 134 may be made of a metallic material such as copper or aluminum. For example, after forming the insulating layer 130, a metal layer (not shown) may be formed on the insulating layer 130, and the bonding pad 132 and the first wiring layer 134 may then be formed by patterning the metal layer.

A second insulating layer 140 may be formed on the insulating layer 130, the bonding pad 132 and the first wiring layer 134, and a second wiring layer 142 may be formed on the second insulating layer 140. A third insulating layer 144 may be formed on the second insulating layer 140 and the second wiring layer 142, and a third wiring layer 146 may be formed on the third insulating layer 144. A passivation layer 148 may be formed on the third insulating layer 144 and the third wiring layer 146. The first, second and third wiring layers 134, 142 and 146 may be electrically connected with the pixel regions 120, and the bonding pad 132 may be electrically connected with the first, second and third wiring layers 134, 142 and 146.

Figure 7:
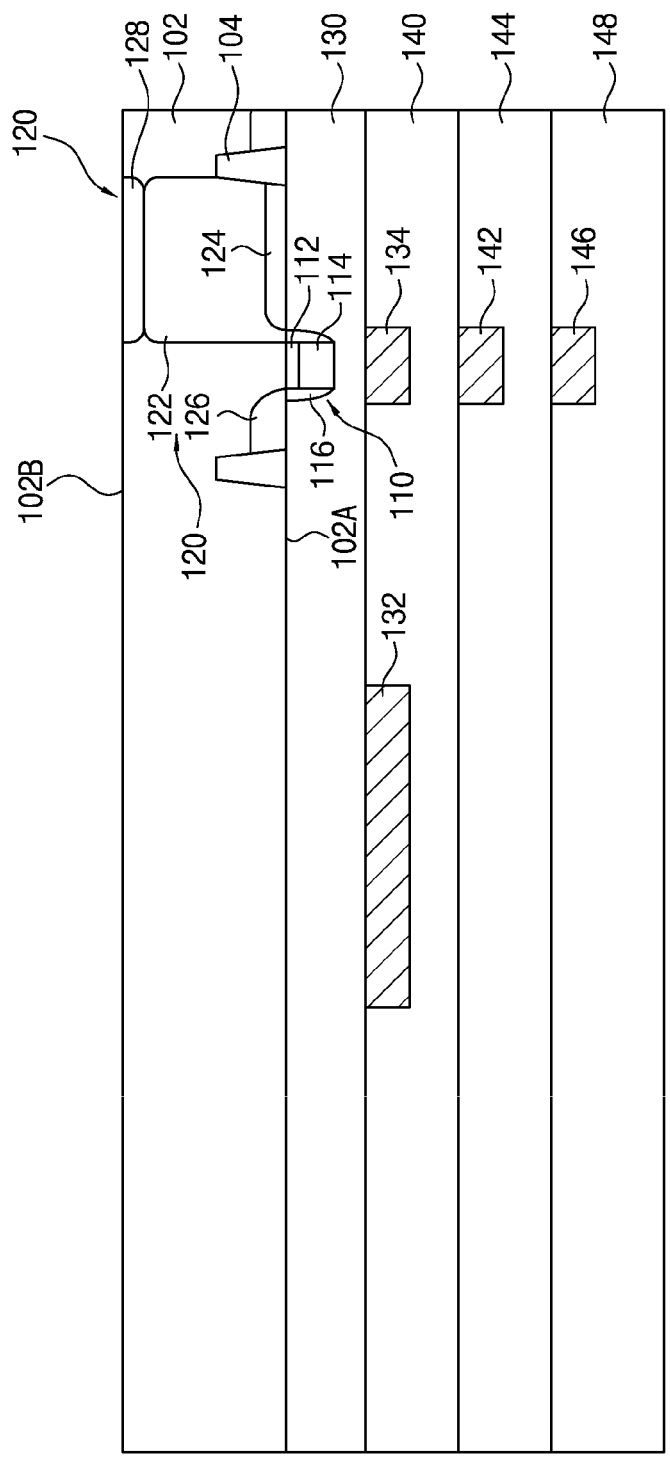

Referring to FIG. 7, a back-grinding process and/or a chemical and mechanical polishing process may be performed in order to reduce a thickness of the substrate 102. Further, backside pinning layers 128 having the first conductivity type may be formed between a backside surface 102B of the substrate 102 and the charge accumulation regions 122. For example, p-type impurity regions functioning as the backside pinning layers 128 may be formed by an ion implantation process, and may then be activated by a subsequent laser annealing process.

Alternatively, the backside pinning layers 128 may be formed prior to the charge accumulation regions 122. For example, after forming the backside pinning layers 128, the charge accumulation regions 122 may be formed on the backside pinning layers 128, and the frontside pinning layers 124 may then be formed on the charge accumulation regions 122. In such case, the backside pinning layers 128 may be activated by the rapid heat treatment process along with the charge accumulation regions 122 and the frontside pinning layers 124. Further, the back-grinding process may be performed such that the backside pinning layers 128 are exposed.

Meanwhile, when the substrate 102 includes a bulk silicon substrate and a p-type epitaxial layer formed on the bulk silicon substrate, the charge accumulation regions 122 and the frontside and backside pinning layers 124 and 128 may be formed in the p-type epitaxial layer, and the bulk silicon substrate may be removed by the back-grinding process.

Figure 8:
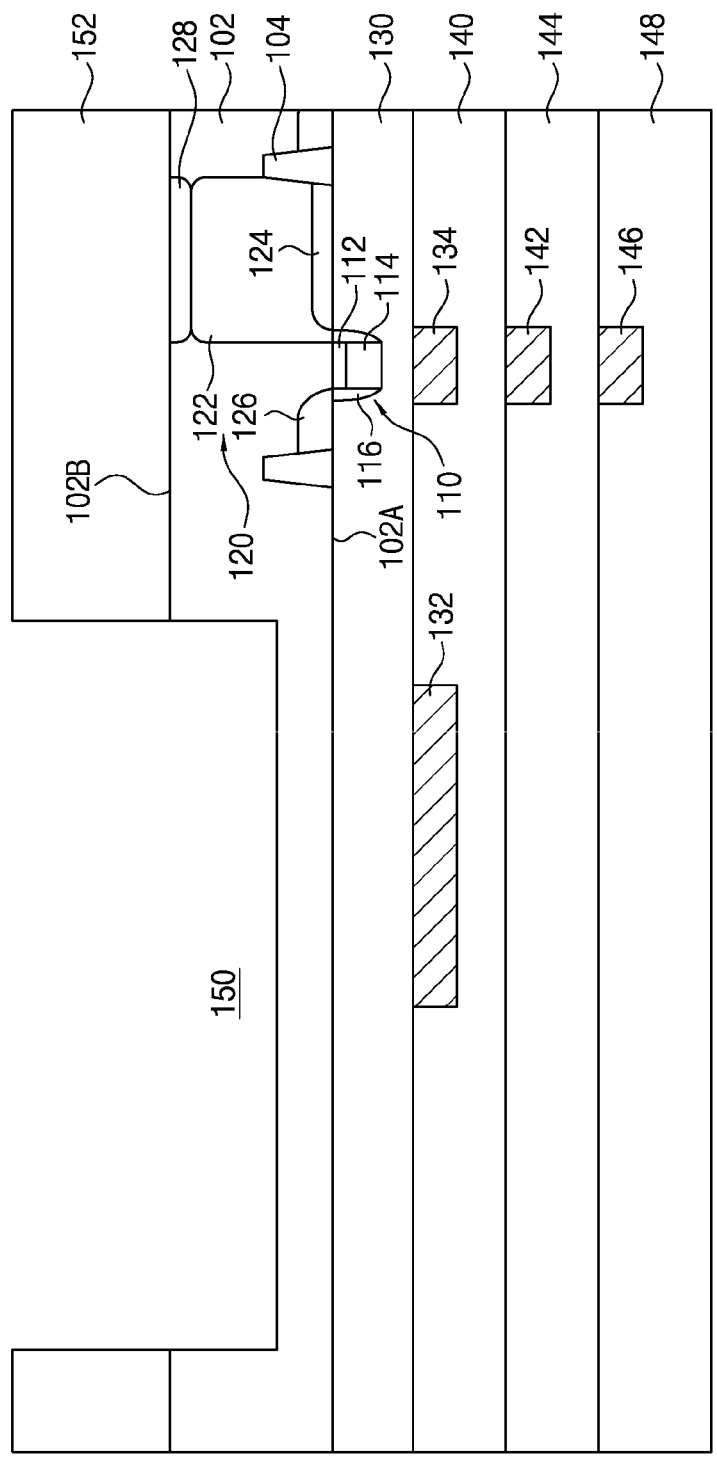

Referring to FIG. 8, the substrate 102 may be partially removed so as to form a recess 150 corresponding to the bonding pad 132 in a backside surface portion of the substrate 102. For example, a first photoresist pattern 152 may be formed on the backside surface 102B of the substrate 102, which exposes a portion of the backside surface 102B of the substrate 102 to correspond to the bonding pad 132. The recess 150 may be formed by an anisotropic etching process using the first photoresist pattern 152 as an etching mask. The recess 150 may have a larger width than the bonding pad 132, and the anisotropic etching process for forming the recess 150 may be performed for a predetermined time so that the recess 150 has a predetermined depth. The first photoresist pattern 152 may be removed by an ashing or stripping process after forming the recess 150.

Figure 9:
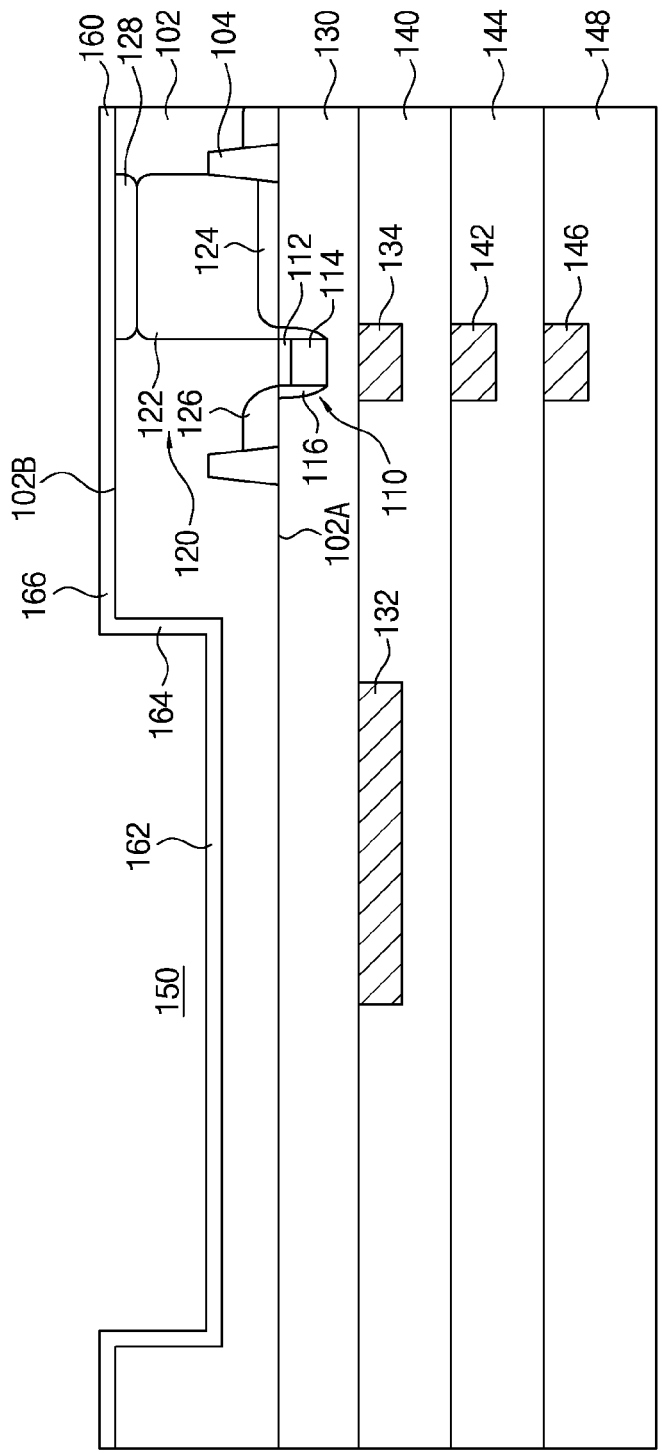

Referring to FIG. 9, an anti-reflective layer 160 may be formed on the backside surface 102B of the substrate 102, and an inner side surface and a bottom surface of the recess 150. For example, a metal oxide layer, a silicon oxide layer and a silicon nitride layer functioning as the anti-reflective layer 160 may be sequentially formed on the backside surface 102B of the substrate 102, and the inner side surface and the bottom surface of the recess 150. The metal oxide layer may be formed by a metal organic chemical vapor deposition (MOCVD) process or an atomic layer deposition (ALD) process, and the silicon oxide layer and the silicon nitride layer may be formed by a chemical vapor deposition (CVD) process. At this time, the anti-reflective layer 160 may include a first portion 162 formed on the bottom surface of the recess 150, a second portion 164 formed on the inner side surface of the recess 150, and a third portion 166 formed on a second backside surface portion of the substrate 102 adjacent to the recess 150.

Figure 10:
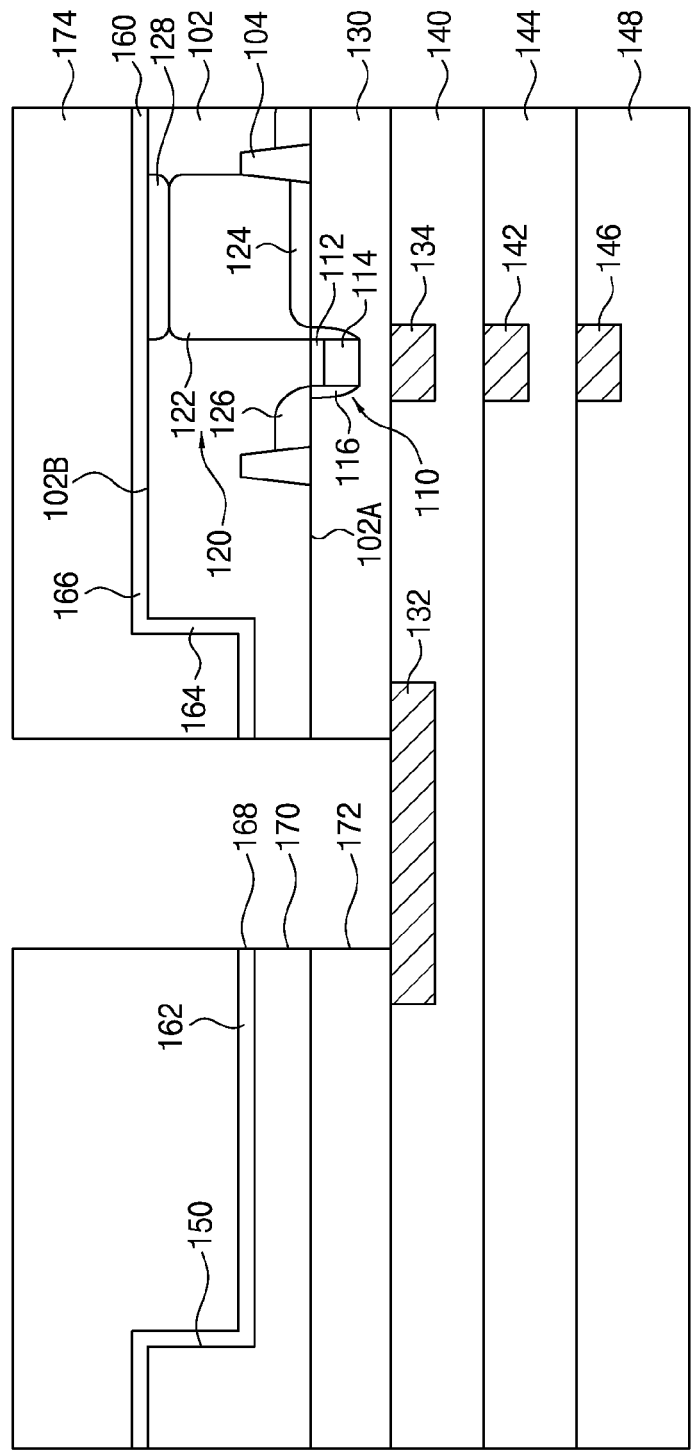

Referring to FIG. 10, the first portion 162 of the anti-reflective layer 160, the substrate 102 and the insulating layer 130 may be partially removed so as to form a first through-hole 168, a second through-hole 170 and a third through-hole 172 through which partially expose a backside surface of the bonding pad 132. For example, a second photoresist pattern 174 may be formed on the anti-reflective layer 160, which partially exposes the first portion 162 of the anti-reflective layer 160. The first through-hole 168, the second through-hole 170 and the third through-hole 172 may be formed by an anisotropic etching process using the second photoresist pattern 174 as an etching mask. The second photoresist pattern 174 may be removed by an ashing or stripping process after forming the first through-hole 168, the second through-hole 170 and the third through-hole 172.

Figure 11:
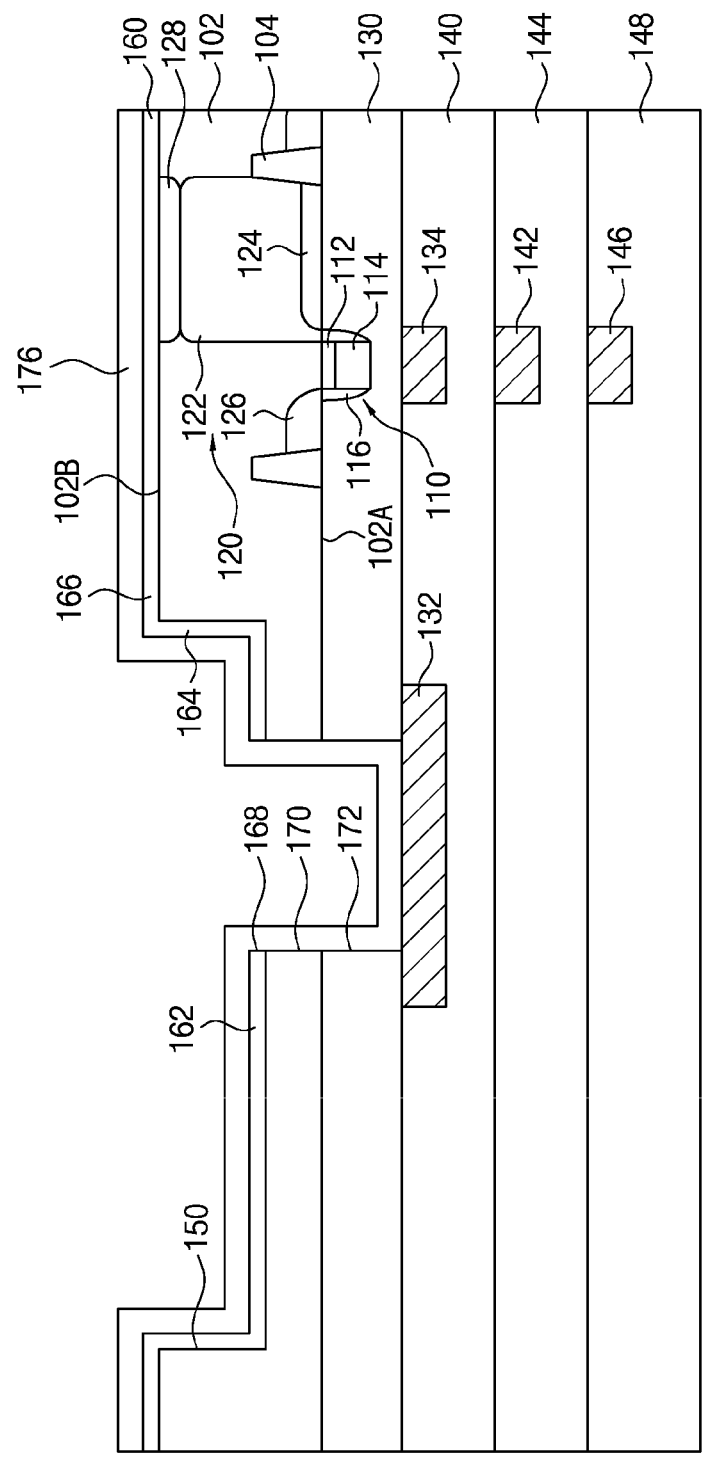

Referring to FIG. 11, a spacer layer 176 may be formed to have a uniform thickness on the anti-reflective layer 160, inner side surfaces of the first, second and third through-holes 168, 170 and 172, and a portion of the backside surface of the bonding pad 132 exposed by the first, second and third through-holes 168, 170 and 172. For example, the spacer layer 176 may include silicon oxide and may be formed by a CVD process.

Figure 12:
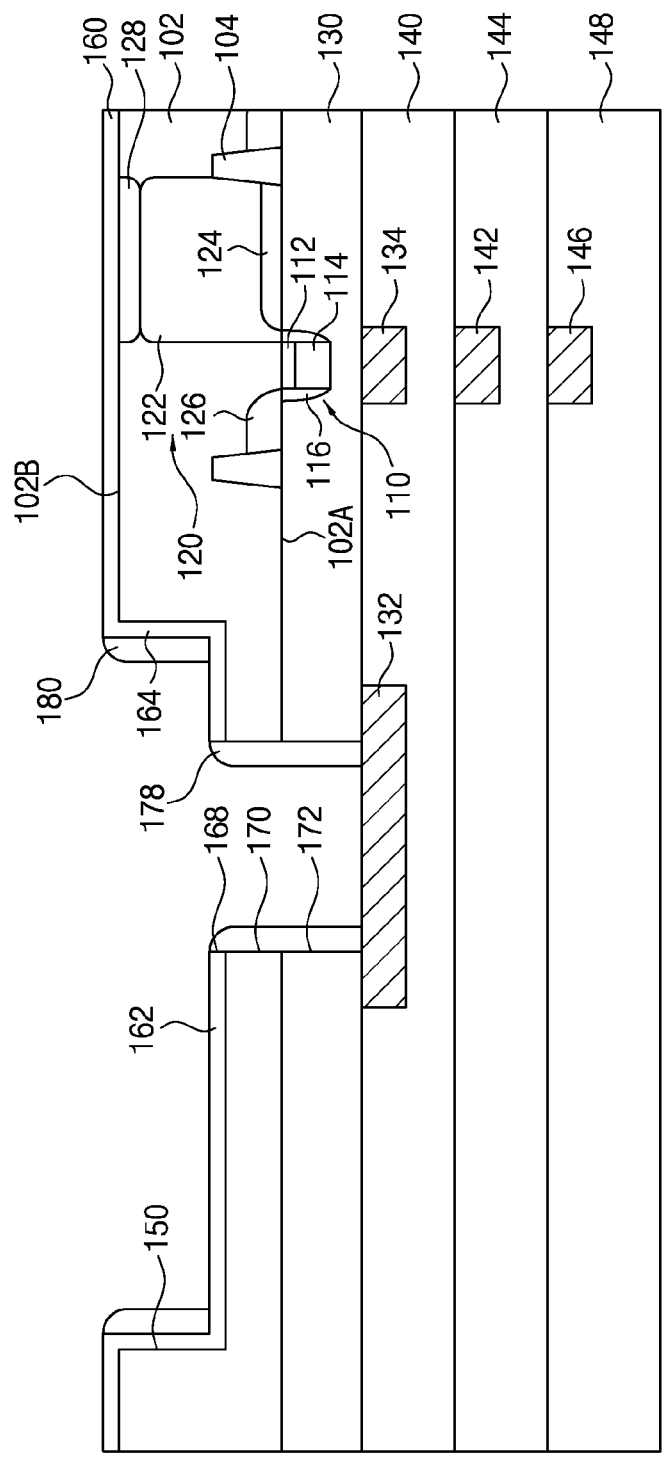

Referring to FIG. 12, the spacer layer 176 may be partially removed to form a first spacer 178 and a second spacer 180. The first spacer 178 may be formed on the inner side surfaces of the first, second and third through-holes 168, 170 and 172, and the second spacer 180 may be formed on the second portion 164 of the anti-reflective layer 160. For example, the spacer layer 176 may be partially removed by an anisotropic etching process. Particularly, a portion of the spacer layer 176 disposed on the backside surface 102B of the substrate 102 may be fully removed while forming the first and second spacers 178 and 180.

Figure 13:
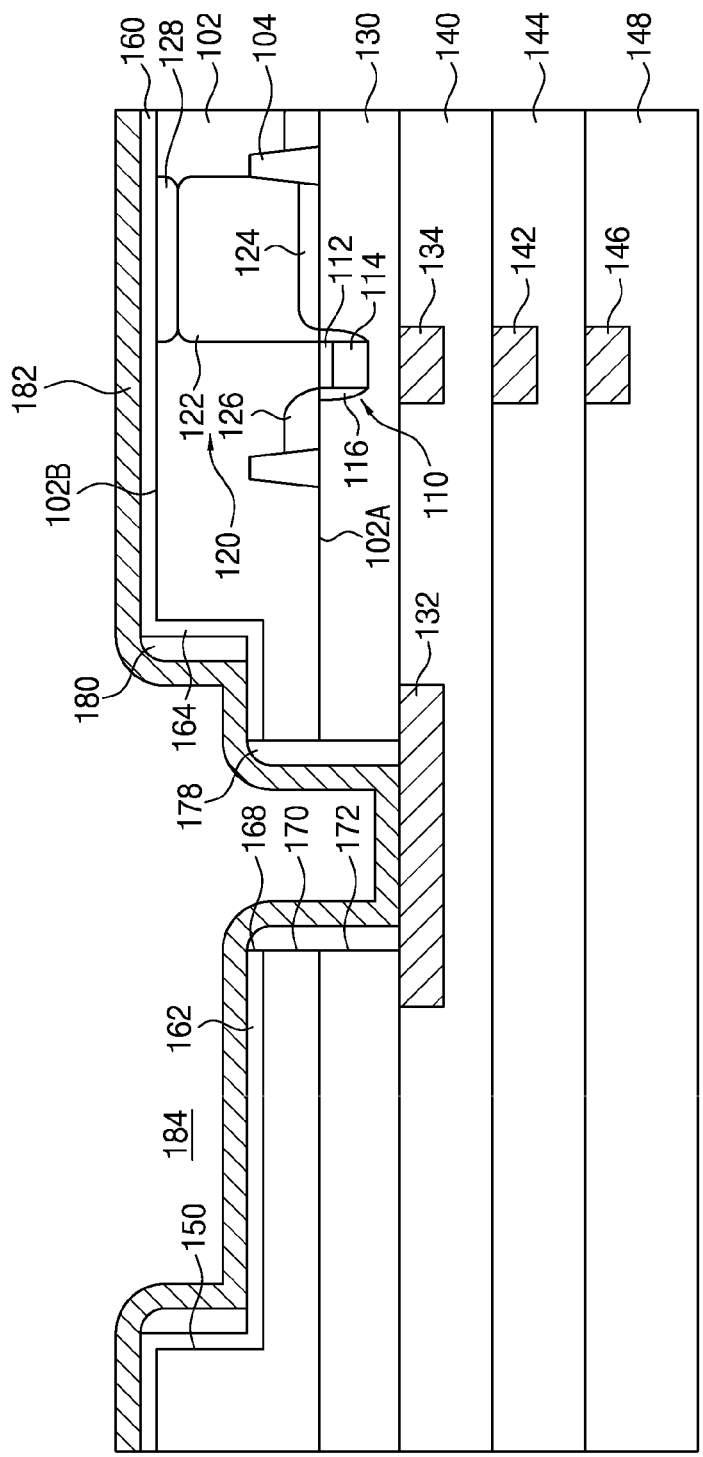

Referring to FIG. 13, a second metal layer 182, e.g., a tungsten layer, may be conformally formed on the anti-reflective layer 160, the first and second spacers 178 and 180, and the exposed portion of the backside surface of the bonding pad 132, and further, and a second recess 184 may be formed in the recess 150 by the second metal layer 182. The second metal layer 182 may have a predetermined constant thickness, and thus, a depth of the second recess 184 may be the same as the depth of the recess 150.

Figure 14:
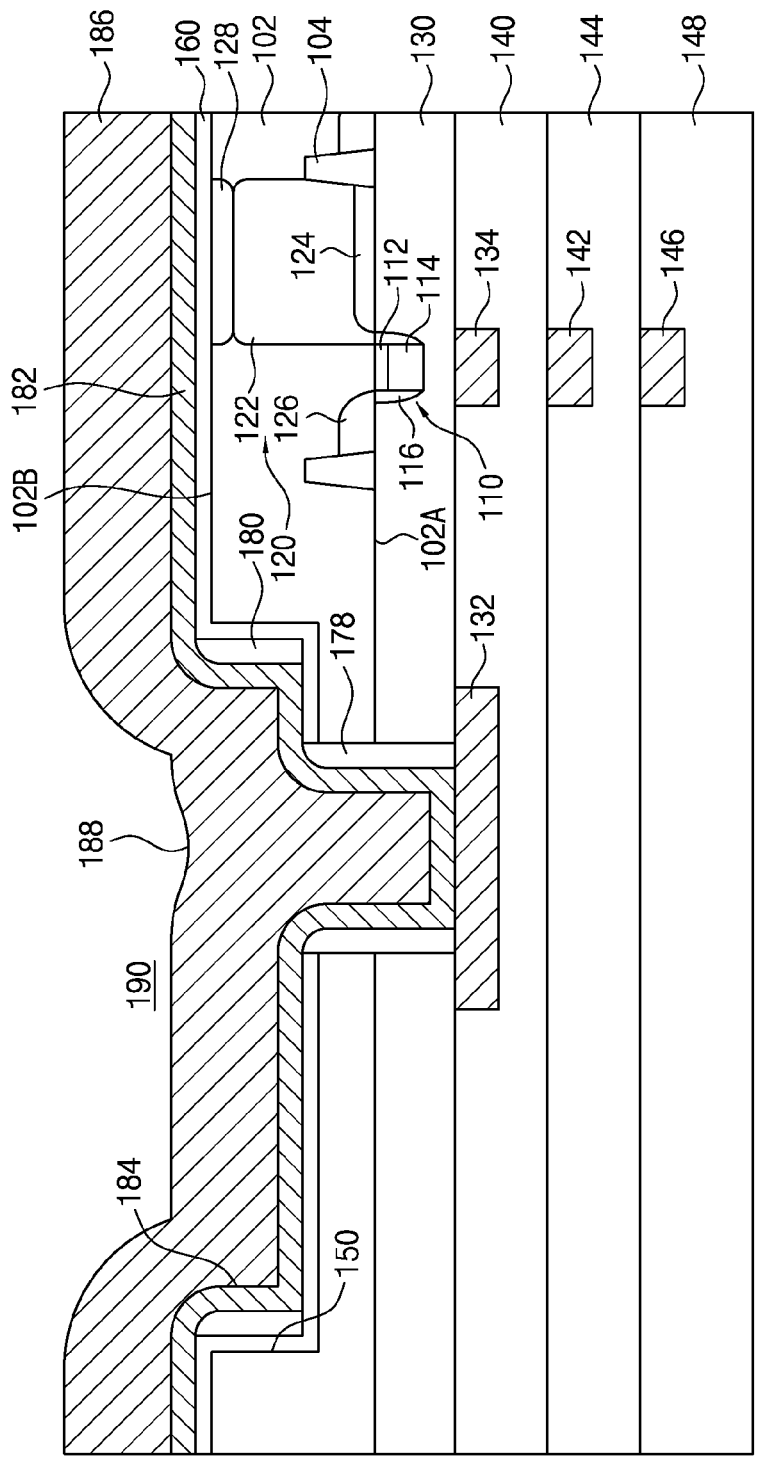

Referring to FIG. 14, a third metal layer 186, e.g., an aluminum layer, may be formed with a predetermined constant thickness on the second metal layer 182. Particularly, the thickness of the third metal layer 186 may be the same as the depth of the second recess 184 so that the second recess 184 is filled by the third metal layer 186. At this time, the first through-hole 168, the second through-hole 170 and the third through-hole 172 may be filled by the third metal layer 186, and a third recess 188 corresponding to the first through-hole 168, the second through-hole 170 and the third through-hole 172 may be formed in an upper surface portion of the third metal layer 186. Further, the third metal layer 186 may have a fourth recess 190 corresponding to the second recess 184, and the third recess 188 may be formed in a bottom surface portion of the fourth recess 190.

Figure 15:
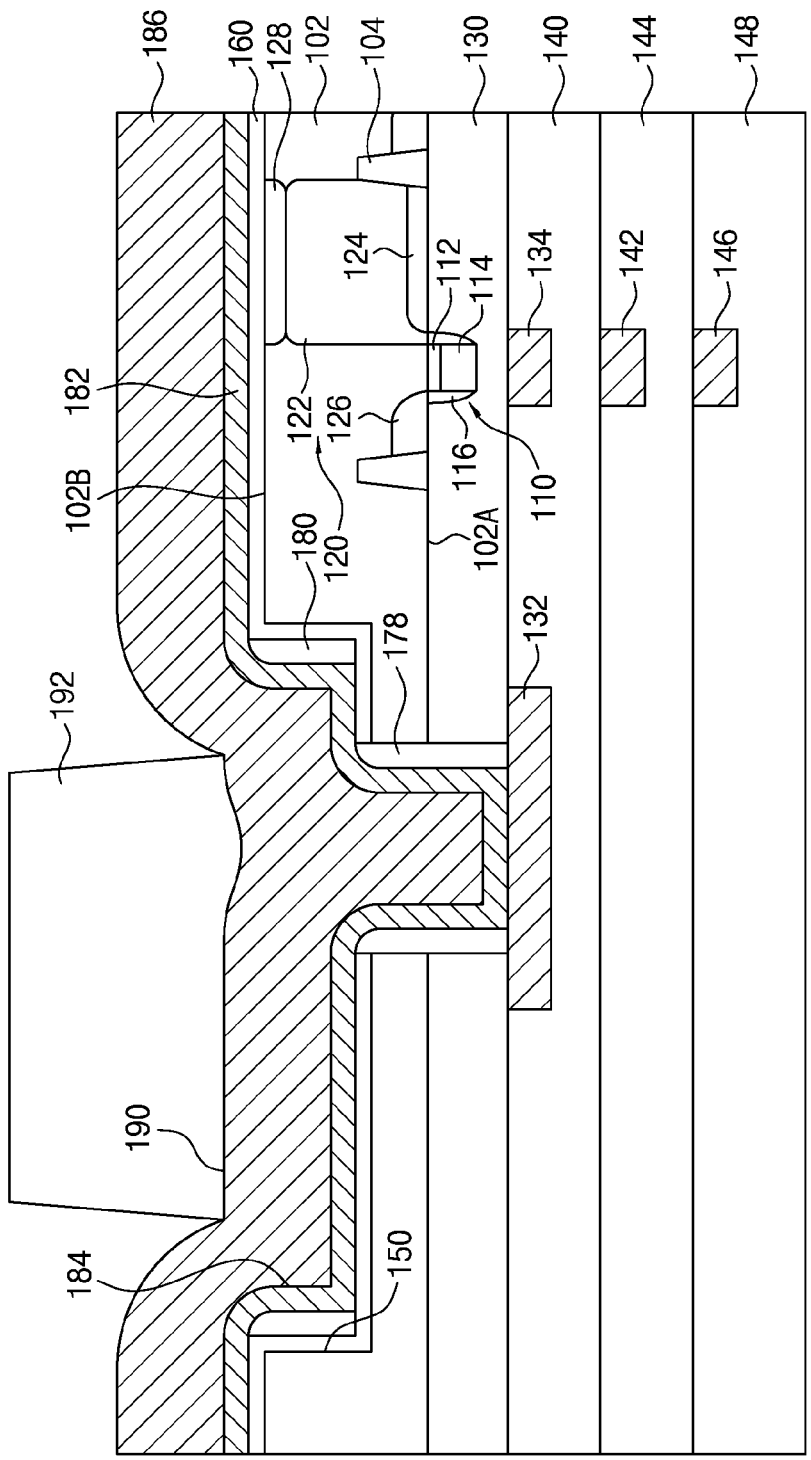
Figure 16:
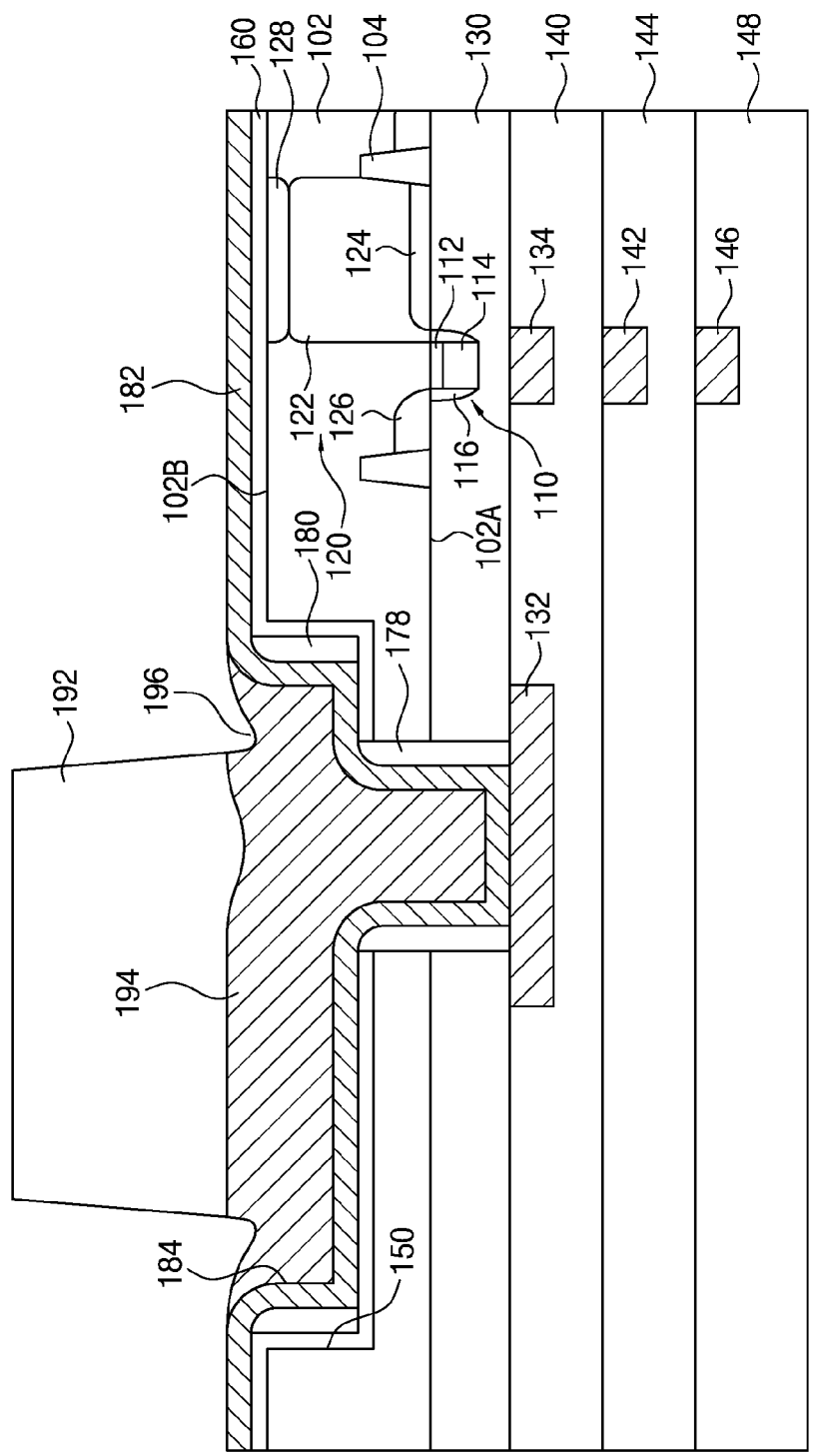

Referring to FIGS. 15 and 16, a third photoresist pattern 192 may be formed on the third metal layer 186, and a third bonding pad 194 may be formed on the second metal layer 182 by patterning the third metal layer 186 using the third photoresist pattern 192. Specifically, the third photoresist pattern 192 may be formed on a bottom surface of the fourth recess 190, and the third bonding pad 194 may be formed by performing an anisotropic etching process using the third photoresist pattern 192 as an etch mask. The third photoresist pattern 192 may be removed by an ashing or strip process after the third bonding pad 194 is formed.

Particularly, during the anisotropic etching process using the third photoresist pattern 192, portions of the third metal layer 186 on the second metal layer 182 may be removed, and thus, the third bonding pad 194 may be formed in the second recess 184. Further, during the anisotropic etching process using the third photoresist pattern 192, a ring-shaped groove 196 may be formed on an upper surface of the third bonding pad 194, that is, a backside edge portion of the third bonding pad 194 as shown in FIG. 16.

Figure 17:
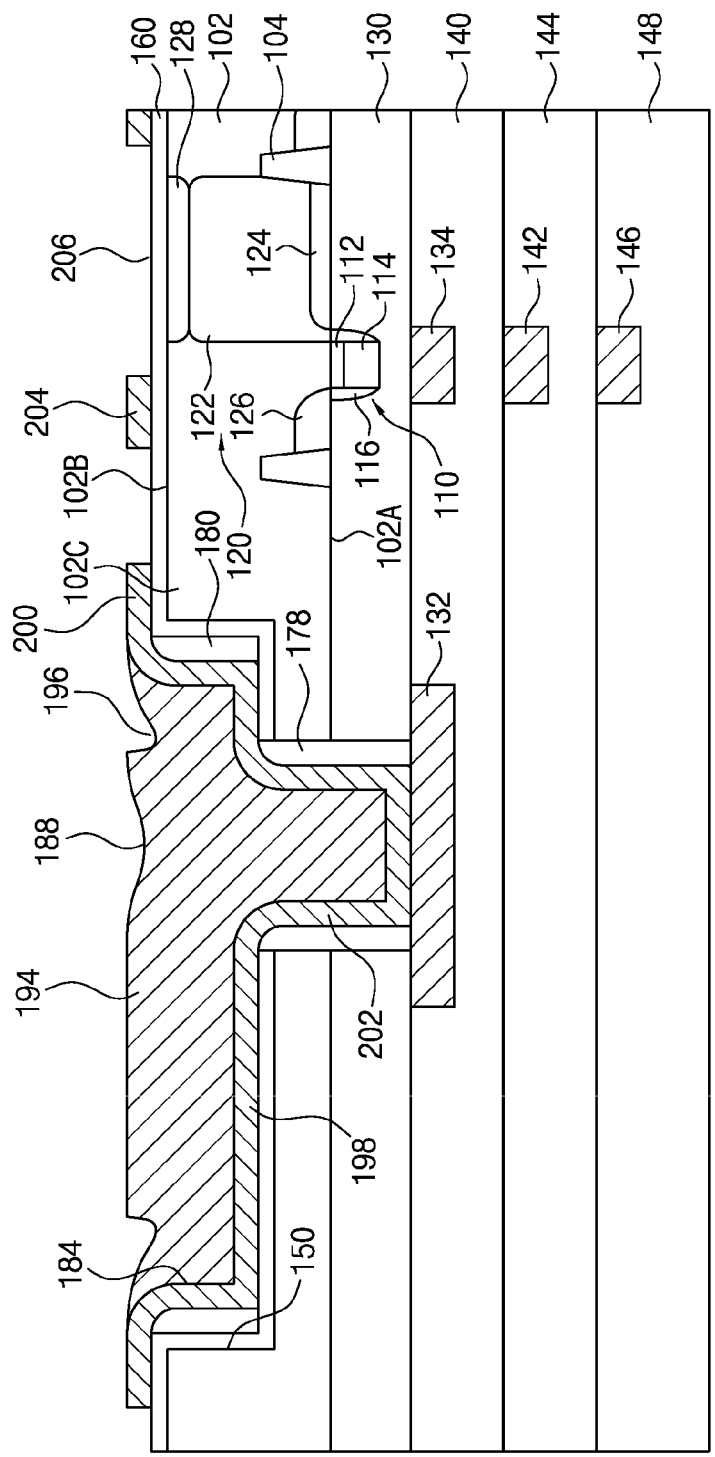

Referring to FIG. 17, a second bonding pad 198 connected to the bonding pad 132 may be formed in the recess 150 by patterning the second metal layer 182. Particularly, the second bonding pad 198 may include an edge portion 200 formed on a second backside surface portion 102C of the substrate 102 adjacent to the recess 150 and a connecting portion 202 connected to the bonding pad 132. Further, a light-blocking pattern layer 204 having openings 206 corresponding to the pixel regions 120 may be formed by patterning the second metal layer 182. That is, the second bonding pad 198 and the light-blocking pattern layer 204 may be simultaneously formed of the same material.

Figure 18:
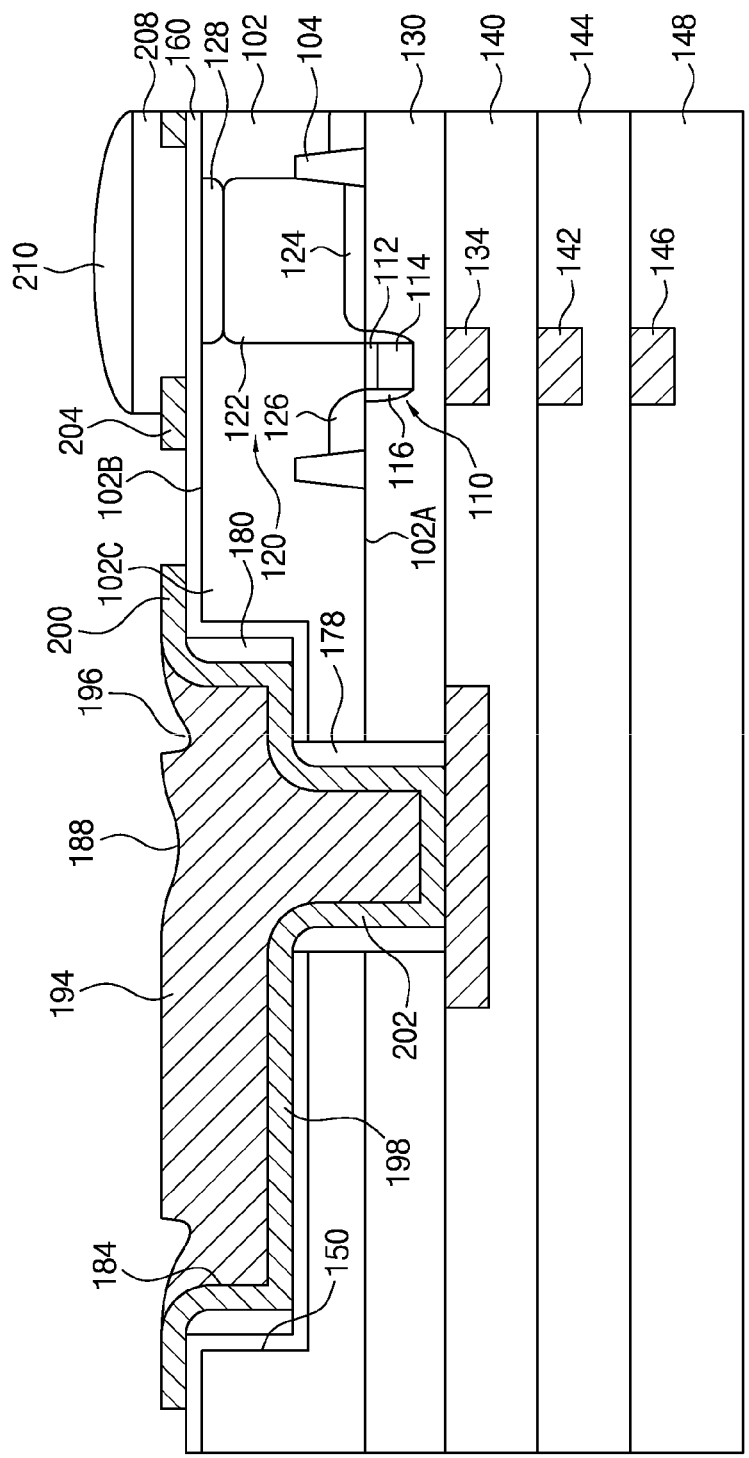

Referring to FIG. 18, a color filter layer 208 and a microlens array 210 may be sequentially formed on the anti-reflective layer 160 and the light-blocking pattern layer 204. Alternatively, as shown in FIG. 2, a planarization layer 240 may be formed on the anti-reflective layer 160 and the light-blocking pattern layer 204, and then, a color filter layer 242 and a microlens array 244 may be sequentially formed on the planarization layer 240. Particularly, when a third bonding pad 230 is formed to be relatively thick as shown in FIG. 2, a depth of a groove 232 formed on an upper surface, that is, a backside surface of the third bonding pad 230 may be reduced.

Although the example embodiments of the present invention have been described with reference to the specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A backside illuminated image sensor comprising:
   a substrate having a frontside surface and a backside surface, and the substrate defining a recess formed in a backside surface portion thereof;
   at least one pixel region disposed in the substrate;
   an insulating layer disposed on the frontside surface of the substrate;
   a bonding pad disposed on a frontside surface of the insulating layer;
   a second bonding pad having a constant thickness and disposed on a bottom surface and an inner side surface of the recess, the second bonding pad defining a second recess formed within the recess and being electrically connected with the bonding pad;
   a third bonding pad formed in the second recess and arranged to fill the second recess; and
   an anti-reflective layer disposed on the backside surface of the substrate and the bottom surface and the inner side surface of the recess,
   wherein the second bonding pad is formed on the anti-reflective layer,
   the anti-reflective layer, the substrate and the insulating layer have a first through-hole, a second through-hole and a third through-hole for exposing a portion of a backside surface of the bonding pad, respectively, and
   the second bonding pad comprises a connecting portion formed on inner side surfaces of the first through-hole, the second through-hole and the third through-hole, and the exposed portion of the backside surface of the bonding pad.

2. The backside illuminated image sensor of claim 1, wherein the second bonding pad comprises an edge portion formed on a second backside surface portion of the substrate adjacent to the recess.

3. The backside illuminated image sensor of claim 2, wherein the third bonding pad has a thickness equal to a depth of the second recess.

4. The backside illuminated image sensor of claim 3, further comprising:
   a light-blocking pattern layer formed on the backside surface of the substrate and having openings corresponding to the pixel regions, respectively,
   wherein the thickness of the second bonding pad is the same as a thickness of the light-blocking pattern layer.

5. The backside illuminated image sensor of claim 2, wherein when the backside surface of the substrate faces upward, the third bonding pad is formed to protrude upward from the edge portion of the second bonding pad.

6. The backside illuminated image sensor of claim 5, further comprising:
   a light-blocking pattern layer formed on the backside surface of the substrate and having openings corresponding to the pixel regions, respectively; and
   a planarization layer formed on the backside surface of the substrate and the light-blocking pattern layer,
   wherein when the backside surface of the substrate faces upward, an upper surface of the third bonding pad has a same height as a height of an upper surface of the planarization layer.

7. The backside illuminated image sensor of claim 1, further comprising:
   a spacer formed on the inner side surfaces of the first through-hole, the second through-hole and the third through-hole,
   wherein the connecting portion of the second bonding pad is formed on the spacer.

8. The backside illuminated image sensor of claim 1, wherein the third bonding pad has a third recess corresponding to the first through-hole, the second through-hole and the third through-hole.

9. The backside illuminated image sensor of claim 1, further comprising:
   a second spacer formed between a portion of the anti-reflective layer formed on the inner side surface of the recess and the second bonding pad.

10. The backside illuminated image sensor of claim 1, wherein a ring-shaped groove is formed on a backside surface of the third bonding pad.

\* \* \* \* \*